United States Patent [19]
Smentkowski et al.

[11] Patent Number: 5,698,272
[45] Date of Patent: Dec. 16, 1997

[54] METHOD FOR LUBRICATION OF DIAMOND-LIKE CARBON SURFACES

[75] Inventors: Vincent S. Smentkowski, Lisle, Ill.; John T. Yates, Jr., Allison Park, Pa.

[73] Assignee: University of Pittsburgh of the Commonwealth System of Higher Education, Pittsburgh, Pa.

[21] Appl. No.: 764,392

[22] Filed: Dec. 11, 1996

Related U.S. Application Data

[63] Continuation-in-part of Ser. No. 521,894, Aug. 31, 1995, Pat. No. 5,665,435.

[51] Int. Cl.$^6$ ........................... B05D 3/06
[52] U.S. Cl. ............... 427/551; 427/553; 427/249
[58] Field of Search ........................... 427/249, 551, 427/553

[56] References Cited

PUBLICATIONS

Cadman et al., "Identification of Functional Groups on the Surface of a Fluorinated Diamond Crystal by Photoelectron Spectroscopy", *J.C.S. Chem. Comm.*, pp. 654–655, 1975.
Morar et al., "C I s excitation studies of diamond (III). I. Surface core levels", *The American Physical Society*, Physical Review B. vol. 33, No. 2, pp. 1340–1345, 1986.
Morar et al., "C I s excitation studies of diamond (III). II. Unoccupied surface states", *The American Physical Society*, Physical Review B, vol. 33, No. 2, pp. 1346–1349, 1986.
Bachmann et al., "Emerging Technology of Diamond Thin Films", *Chemical and Engineering News*, vol. 67, No. 20, pp. 24–39, 1989.
Pallerson et al., "Fluorinated Diamond Films, Slabs, and Grit", *Materials Research Society Symposium Proceedings*, vol. 140, pp. 351–356, 1989.
Hsu et al., "Fluorination of Diamond (III) Single Crystal Surfaces By XeF$_2$", *Fourth SDIO/IST ONR Diamond Technology Initiative Symposium*, Jul. 1989. No page number !.
Pool, "Diamond Films Sparkle As They Come to Market", *Science*, vol. 249, No. 4964, pp. 27–28, 1990.
Feder, "Industry's Growing Romance With Diamonds", *The New York Times*, p. D5, Feb. 21, 1990.
Koshland, "The Molecule of the Year", *Science*, vol. 250, No. 4988, p. 1637, 1990.
Freedman et al., "Fluorination of diamond (100) by atomic and molecular beams", *Appl. Phys. Lett.*, vol. 57, No. 12, pp. 1194–1196, 1990.

(List continued on next page.)

*Primary Examiner*—Roy V. King
*Attorney, Agent, or Firm*—Alan G. Towner; Arnold B. Silverman; Eckert Seamans Cherin & Mellott, LLC

[57] ABSTRACT

An improved method for the lubrication of diamond-like carbon surfaces comprises condensing a layer of perflourinated alkyl halides of the formula $C_nF_{2n+1}X$, wherein n is a positive integer from 1 to 13 and X is selected from I, Br and Cl, on the diamond-like carbon surface. Perflourinated alkyl free radicals are then produced by photodecomposing C—X bonds of said perflourinated alkyl halides on the surface. The diamond-like carbon surface is reacted with photochemically produced perflourinated alkyl radicals thereby anchoring photochemically induced photofragments of the perflourinated alkyl halides to the surface forming a perflourinated alkyl layer. The perfluorinated alkyl layer is preferably decomposed on the diamond-like carbon surface to cause the fluorination of the surface by atomic F. The method preferably achieves greater than one fluorine atom per surface carbon atom chemisorbed on the diamond-like carbon. The fluorination process produces lubricated diamond-like carbon surfaces that are particularly suitable for computer hard disks.

13 Claims, 1 Drawing Sheet

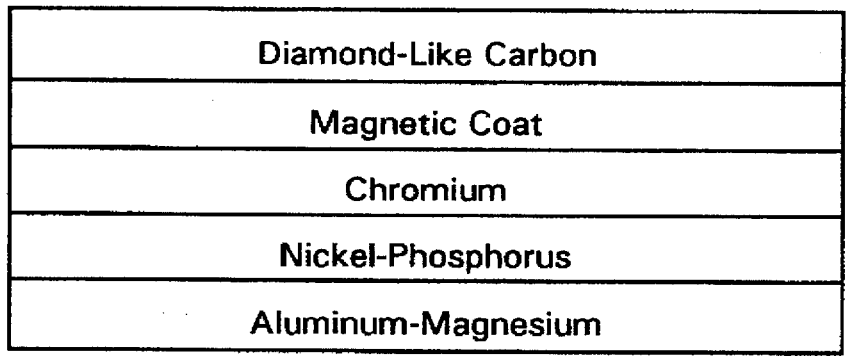

OTHER PUBLICATIONS

Freedman et al., "Fluorination of Diamond (100) by Atomic and Molecular Beams", *New Diamond Science and Technology*, MRS Int. Conf. Proc., vol. 2, pp. 321–336, 1990.

Ritter, "Fluorine Chemistry Branches Out From Its Traditional Focus", *Chemical and Engineering News*, vol. 73, No. 9, 1995.

Lin et al., "Thermal and electron–stimulated chemistry of Fomblin–Zdol lubricant on a magnetic disk", *J. Vac. Sci. Technol. A.*, vol. 13 No. 2, pp. 163–168, 1995 (attached).

Lin et al., "Thermal–and electron–stimulated chemistry of a cyclotriphosphazene lubricant on a magnetic disk with a hard carbon overcoat", *J. Vac. Sci. Technol. A.*, vol. 13, No. 4, pp. 187–181, 1995 (attached).

Smentkowski et al. Mater. Res. Soc. Symp. Proc., 416 (Diamond for Electronic Applications). 293–8, 1996 (Abstract).

Smentkowski et al., Science, 271 (S246), 193–5, 1996.

| Diamond-Like Carbon |
|---|
| Magnetic Coat |
| Chromium |
| Nickel-Phosphorus |
| Aluminum-Magnesium |

METHOD FOR LUBRICATION OF DIAMOND-LIKE CARBON SURFACES

CROSS REFERENCE TO RELATED APPLICATION

This application is a continuation-in-part of U.S. application Ser. No. 08/521,894 filed Aug. 31, 1995, now U.S. Pat. No. 5,665,435 which is incorporated herein by reference.

BACKGROUND OF THE INVENTION

1. Field of the Invention

The present invention relates to the lubrication of hard carbon or diamond-like carbon surfaces. The present invention more particularly relates to the photodecomposition of perfluoroalkyl halides on diamond-like carbon surfaces as an improved method of fluorination of this surface. This invention also relates to using perfluoroalkyl halide molecules as photochemically activated fluorinating agents, photodecomposing the fluoroalkyl halide molecules, attachment of the photofragments to the diamond-like carbon surface and thermal decomposition of the fluoroalkyl ligands. The diamond-like carbon surface may be provided on a computer hard disk or the like.

2. Description of the Prior Art

The surface properties of many materials may be significantly improved by the use of diamond-like carbon film coatings. Diamond-like carbon coatings are chemically similar to diamond, with the main difference being the absence of a well-defined crystal structure. Also, diamond-like carbon contains appreciable amounts of hydrogen present as bound C—H groups.

Hard disks used for memory storage in computers are often coated with a hard carbon or diamond-like carbon film. These durable films require lubrication to prevent abrasion between the magnetoresistive sensor and the disk. With the increase of memory density, which may surpass 10 gb/square inch in the future, smaller and smaller separations between the sensor and the disk will be required.

Development of stable lubricants for 10 gb/square inch magnetic disk technology is an urgent topic in the data storage industry. When a magnetic disk starts or stops its rotation, the read/write head actually rubs the magnetic disk surface. The friction and wear that develop during this sliding contact may lead to failure. Therefore, application of a thin lubricant layer is necessary to reduce the friction and wearing. For high performance lubricity and durability, the lubricant must resist thermal and electric excitation from heat and electrons generated under operating conditions.

The use of perfluoropolyethers (PFPE) as lubricants on rigid magnetic disks with hard carbon overcoats has been studied. See "Thermal and Electron-Stimulated Chemistry of Fomblin-Zdol Lubricant on a Magnetic Disk", Jong-Liang Lin, C. Singh Bhatia and John T. Yates, Jr., *J. Vac. Sci. Technol. A.* 13(2), March/April 1995. In this study, commercially available PFPE lubricant molecules were deposited on a magnetic disk having a hard carbon overcoat. The PFPE molecules were demonstrated to be inherently thermally unstable and also easily decomposed by electron bombardment.

A need therefore exists for improved lubrication in the form of chemically anchored lubricants of relatively small molecule size.

SUMMARY OF THE INVENTION

The present invention has met the above-described need. The present invention provides a method of using perfluorinated alkyl halides of the formula $C_nF_{2n+1}X$, wherein n is a whole integer from 1 to 13 and X is selected from I, Br and Cl, for producing a lubricated diamond-like carbon surface.

The improved method for the lubrication of a diamond-like carbon surface comprises depositing a layer of perfluorinated alkyl halides comprising $C_nF_{2n+1}X$ molecules (where n is from 1 to 13 and X is I, Br or Cl) on the diamond-like carbon surface, producing perfluorinated alkyl radicals by photodecomposing the C—X bonds of the perfluorinated alkyl halide on the diamond-like carbon surface, and reacting the diamond-like carbon surface with the photochemically produced perfluorinated alkyl radicals. The photochemically induced photofragments of the perfluorinated alkyl halide molecules are anchored to the diamond-like carbon surface forming a perfluorinated alkyl layer. Subsequently, the fluorinated alkyl layer may be decomposed on the diamond-like carbon surface to produce chemisorbed fluorine on the surface. The method preferably achieves greater than one fluorine atom per surface carbon atom on the diamond-like carbon surface. The method also produces thermally stable chemisorbed fluorine on the surface. Following photodecomposition of the perfluoroalkyl halide on the diamond-like carbon surface, heating from about 120 to 300K desorbs excess perfluoroalkyl halide on the diamond-like carbon surface. Then a temperature of about 300 to 700K is used to decompose the perfluorinated alkyl layer. A layer of chemisorbed fluorine is thereby produced on the diamond-like carbon surface.

It is an object of this invention to provide an improved method for the fluorination of diamond-like carbon surfaces using electromagnetic radiation-induced activation of perfluoroalkyl halide molecules adsorbed on the diamond-like carbon surface to produce perfluoroalkyl groups chemically bound to the hard carbon.

It is another object of this invention to provide a method wherein the anchored fluoroalkyl groups are an easily controlled source of fluorine for the production of chemisorbed fluorine on the diamond-like carbon surface, by subsequent thermal decomposition.

It is a further object of this invention to provide a method and product wherein the presence of passivating surface C—H groups on the diamond-like carbon does not inhibit fluorination by this method.

It is another object of the present invention to provide fluorinated diamond-like carbon surfaces having a low coefficient of friction.

It is a further object of this invention to provide a fluorinated layer on a diamond-like carbon surface exhibiting high thermal stability.

It is another object of this invention to provide a method and product wherein fluorinated layers have favorable properties in comparison with layers produced by direct fluorination with F atoms.

It is a further object of this invention to provide a method and product wherein more than one fluorine atom is deposited per surface carbon atom on the diamond-like carbon.

These and other objects of the invention will be more fully understood from the following description of the invention and references to the illustration and appended claims hereto.

BRIEF DESCRIPTION OF THE DRAWING

The FIGURE schematically illustrates the cross-sectional structure of a rigid magnetic disk having a diamond-like hard carbon surface layer. In accordance with a preferred embodiment of the present invention, the diamond-like carbon surface is treated in order to produce chemisorbed fluorine on the diamond-like carbon surface.

DESCRIPTION OF THE PREFERRED EMBODIMENTS

The present invention presents an improved method of fluorinating a diamond-like carbon surface. As used herein, the term "diamond-like carbon" means hard carbon that is chemically similar to diamond, but with the absence of a well-defined crystal structure. Diamond-like carbon typically contains appreciable amounts of hydrogen present as bound C—H groups. The hydrogen may comprise from about 1 to about 20 atomic percent of the diamond-like carbon material. Diamond-like carbon is typically provided as a thin coating having a thickness of, for example, from about 50 to about 100 Angstroms. Such coatings are made by techniques including chemical vapor deposition and plasma vapor deposition.

The FIGURE schematically illustrates a cross-section of a conventional computer hard disk having a diamond-like carbon surface layer. The diamond-like carbon surface layer of the disk covers a magnetic coat, which in turn covers a chromium layer. A nickel-phosphorus layer is sandwiched between the chromium layer and an aluminum-magnesium substrate. The nickel-phosphorus film may be electrolessly deposited on the aluminum-magnesium alloy substrate to improve surface hardness and smoothness. The chromium undercoat layer deposited on the nickel-phosphorus film provides improved magnetic properties of the magnetic coat. After application of the magnetic media, the diamond-like carbon layer is deposited. While the diamond-like carbon surface shown in the drawing is provided as part of a magnetic disk, other uses of diamond-like carbon surfaces may apply in accordance with the present invention.

The improved method for the fluorination of a diamond-like carbon surface comprises depositing a layer comprising perfluorinated alkyl halides of the formula $C_nF_{2n+1}X$, wherein n is preferably a positive integer from 1 to 13 and X is selected from I, Br and Cl, on the diamond-like carbon surface. In the formula, $C_nF_{2n+1}X$, X is preferably I due to its lower bond energy. Perfluorinated alkyl radicals are then produced by photodecomposing the C—X bonds of the perfluorinated alkyl halides on the surface, and reacting the diamond-like carbon surface with the photochemically produced perfluorinated alkyl radicals. Photodecomposition is achieved by providing sufficient photon energy to break the C—X bonds. Electromagnetic radiation ranging from ultraviolet to X-ray radiation may be used in the photodecomposition step. The photochemically induced photofragments of the perfluorinated alkyl halide molecules are anchored to the diamond-like carbon surface forming a perfluorinated alkyl layer. This layer may exhibit a low friction coefficient, making it a suitable lubricant. The perfluorinated alkyl layer is then preferably decomposed on the surface to produce chemisorbed fluorine on the diamond-like carbon surface. The method preferably produces more than one fluorine atom per surface carbon atom on the diamond-like carbon surface. The decomposed layer preferably has a low coefficient of friction and acts as a lubricant. The method also produces thermally stable chemisorbed fluorine on the surface.

As noted above, the method of the present invention employs perfluorinated alkyl halides of the formula $C_nF_{2n+1}X$, preferably where n is 1 to 13. For vapor deposition techniques, lower molecular weight compounds are preferred, for example, where n is from 1 to 5. The method also employs the photodecomposition of the perfluoroalkyl halide on the diamond-like carbon surface and heating from about 120 to about 300K for sufficient time to desorb excess perfluoroalkyl iodide on the surface, leaving a chemically bound perfluoroalkyl species. By employing a temperature of from about 300 to 700K to decompose the perfluorinated alkyl layer, a chemisorbed fluorine layer may be produced on the diamond-like carbon surface. Simultaneously, halide atoms from the perfluoroalkyl groups extract hydrogen atoms from the diamond-like carbon surface, making surface sites available for perfluoroalkyl group attachment.

The fluorinated alkyl layer formed on the diamond-like carbon surface decomposes between about 300 and 700K to produce a highly stable form of chemisorbed fluorine on the surface which is thermally stable to about 1500K.

The resultant fluorinated diamond-like carbon surface may thus have thermal stability to at least about 1500K.

A fluorinated diamond-like carbon surface may preferably be produced by the above method selecting a perfluoroalkyl iodide fluorination agent from the group consisting of $CF_3I$, $C_2F_5I$, $C_3F_7I$, $C_4F_9I$, $C_5F_{11}I$, $C_6F_{13}I$, $C_7F_{15}I$, $C_8F_{17}I$, $C_9F_{19}I$, $C_{10}F_{21}I$, $C_{11}F_{23}I$, $C_{12}F_{25}I$ and $C_{13}F_{27}I$. The perfluoroalkyl iodides $C_4F_9I$ and $CF_3I$ are particularly suitable.

Example 1

Exposure of a diamond-like carbon surface to either an effusive beam of $C_4F_9I(g)$ or $CF_3I(g)$ is achieved in an ultrahigh vacuum system by bringing the diamond-like carbon surface to within 4 mm of a 5 mm x 5 mm orifice which accurately delivers the fluoroalkyl iodide beam to the surface. The flow rate is governed by a nominal 2μ diameter pinhole in the gas delivery system, using a Baratron capacitance manometer for measuring the backing pressure. Absolute fluoroalkyl iodide fluxes may be calculated using effusion measurements for $N_2(g)$ and for $Xe(g)$. The role of X-radiation in the fluorination of the diamond-like carbon surface is demonstrated by condensing a thick layer of $C_4F_9I$ on the surface at 119K, irradiating for various times and then desorbing the remaining $C_4F_9I$ by heating the surface to 300K. This leaves a strongly-bound chemisorbed F layer which acts as a lubricant for the diamond-like carbon surface.

Example 2

Example 1 is repeated except ultraviolet light above 2.16 eVa photon energy is used instead of the X-ray radiation to photodecompose the perfluorinated alkyl iodides. A strongly-bound chemisorbed F layer is produced, which acts as a lubricant for the diamond-like carbon surface.

Where particular embodiments of the present invention have been described above, for purposes of the illustration, it will be evident to those skilled in the art that numerous variations of the details may be made without departing from the invention as defined in the appended claims.

What is claimed is:

1. A method for the lubrication of a diamond-like carbon surface comprising:

depositing a layer comprising perfluorinated akyl halides of the formula $C_nF_{2n+1}X$ on said diamond-like carbon surface, wherein n is a positive integer from 1 to 13 and X is selected from the group consisting of I, Br and Cl;

producing perfluorinated alkyl free radicals by photodecomposing C—X bonds of said perfluorinated alkyl halides on said diamond-like carbon surface; and forming a perfluorinated alkyl layer by chemically bonding said photochemically induced perfluorinated alkyl free radicals to said diamond-like carbon surface.

2. The method of claim 1, further comprising decomposing said perfluorinated alkyl layer on said diamond-like carbon surface to produce chemisorbed fluorine on said diamond-like carbon surface.

3. The method of claim 1, wherein X is I.

4. The method of claim 3, wherein n is 4.

5. The method of claim 2, wherein the perfluorinated alkyl halide comprises $C_4F_9I$.

6. The method of claim 2, wherein the perfluorinated alkyl halide comprises $CF_3I$.

7. The method of claim 2, including establishing by said process greater than one fluorine atom per surface carbon atom chemisorbed on said diamond-like carbon surface.

8. The method of claim 2, wherein the chemisorbed fluorine remains on said diamond-like carbon surface up to a temperature of about 1500K.

9. The method of claim 2, wherein the photodecomposing is achieved by at least one of X-radiation or ultraviolet light.

10. The method of claim 2, including employing a temperature of from about 120 to about 300K to desorb excess perfluoroalkyl halide on said diamond-like carbon surface.

11. The method of claim 2, including employing a temperature of from about 300 to about 700K to decompose said perfluorinated alkyl layer to produce said chemisorbed fluorine on said diamond-like carbon surface.

12. The method of claim 2, including employing halide atoms from said perfluoroalkyl halides to extract hydrogen from said diamond-like carbon surface.

13. The method of claim 2, wherein the diamond-like carbon surface is formed on a computer disk.

* * * * *